(12) United States Patent
Gomikawa et al.

(10) Patent No.: US 7,876,610 B2
(45) Date of Patent: Jan. 25, 2011

(54) MEMORY CELL ARRAY WITH SPECIFIC PLACEMENT OF FIELD STOPPERS

(75) Inventors: Kenji Gomikawa, Yokohama (JP);
Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 288 days.

(21) Appl. No.: 11/671,138

(22) Filed: Feb. 5, 2007

(65) Prior Publication Data
US 2007/0208903 A1    Sep. 6, 2007

(30) Foreign Application Priority Data
Mar. 1, 2006    (JP)    .............................. 2006-055044

(51) Int. Cl.
*H01L 27/115*    (2006.01)
*H01L 21/8247*    (2006.01)

(52) U.S. Cl. .................. 365/185.01; 365/149; 365/182; 365/185.13; 365/185.17; 365/185.18; 365/230.06; 438/158; 438/257; 711/101; 257/59; 257/306; 257/309; 257/311; 257/314; 257/315; 257/321; 257/405; 257/410; 257/905; 257/908; 257/E29.162

(58) Field of Classification Search ............ 365/230.06, 365/185.17, 185.13, 185.18, 15, 63, 185.12, 365/185.16, 185.11, 149, 182, 185.01; 711/101; 257/59, 405, E29.162, 309, 306, 308, 311, 257/908, 905, 314, 315, 321, 410; 438/158, 438/257
See application file for complete search history.

(56) References Cited

U.S. PATENT DOCUMENTS 5,946,230 A *    8/1999    Shimizu et al. ......... 365/185.01
2005/0265109 A1*    12/2005    Goda et al. ............ 365/230.06

FOREIGN PATENT DOCUMENTS

JP    2002-324400    11/2002

OTHER PUBLICATIONS

U.S. Appl. No. 12/338,417, filed Dec. 18, 2008, Kato, et al.

* cited by examiner

*Primary Examiner*—Fernando L Toledo
*Assistant Examiner*—John P Dulka
(74) *Attorney, Agent, or Firm*—Oblon, Spivak, McClelland, Maier & Neustadt, L.L.P.

(57) ABSTRACT

A plurality of first transistors formed on a substrate share a gate electrode. Isolation regions isolate the plurality of first transistors from one another. In the region where the plurality of first transistors, an impurity region is formed in such a manner that it includes the source and drain regions of the plurality of first transistors and that the depth of the impurity region is greater than the depth of the source and drain regions. The impurity region sets the threshold voltage of the first transistors.

11 Claims, 16 Drawing Sheets

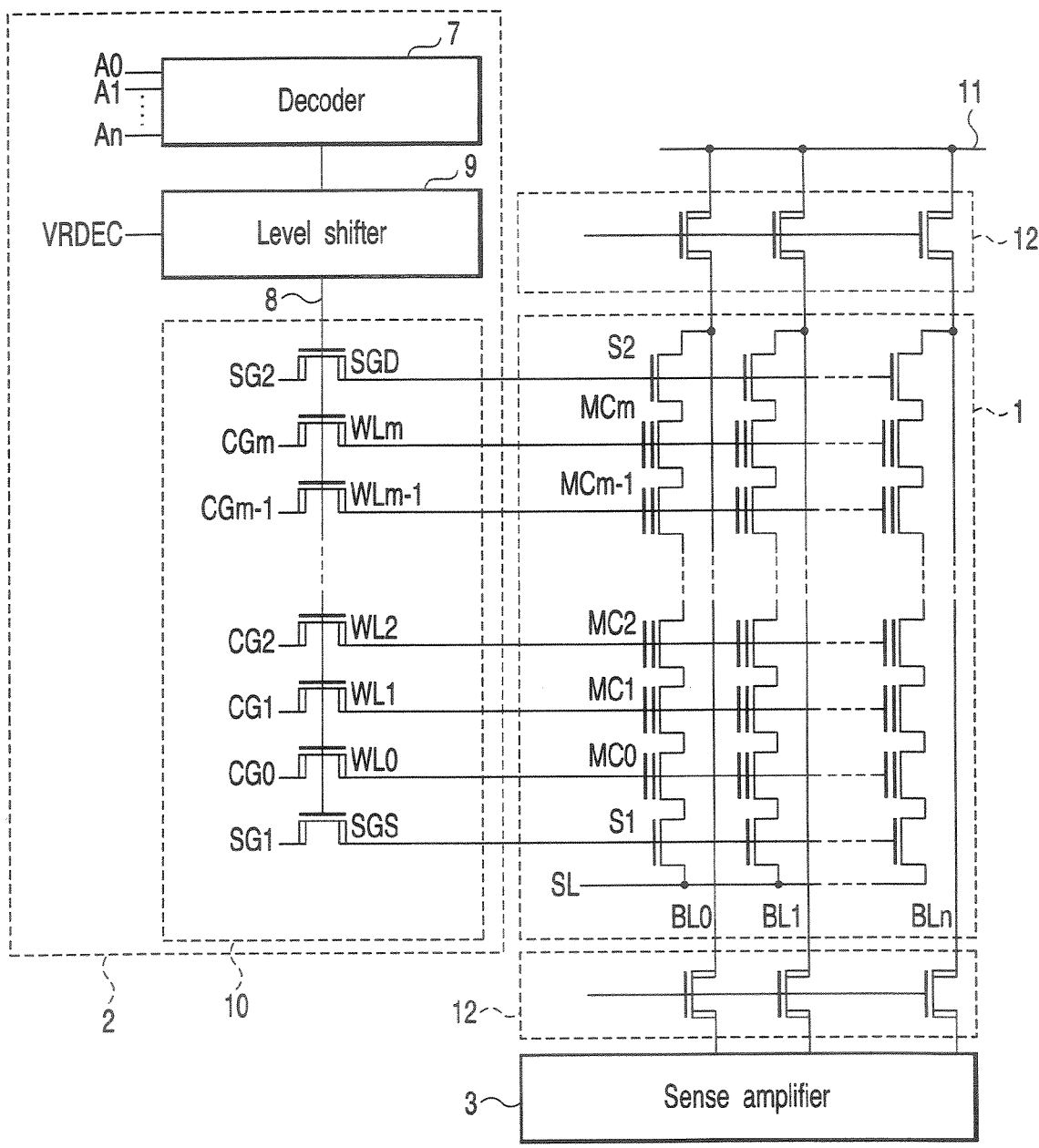
F I G. 2

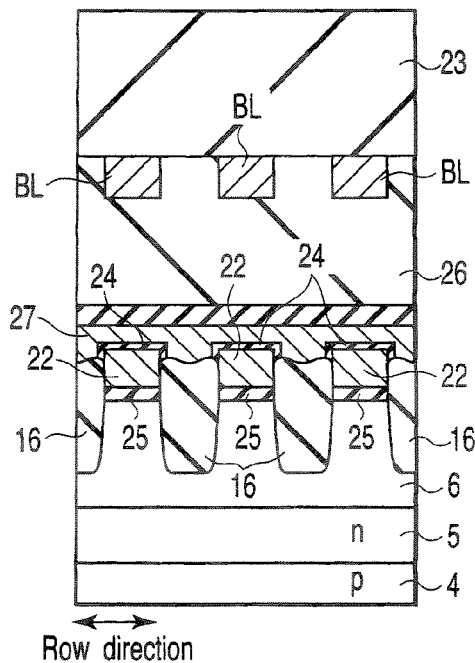
F I G. 4 A
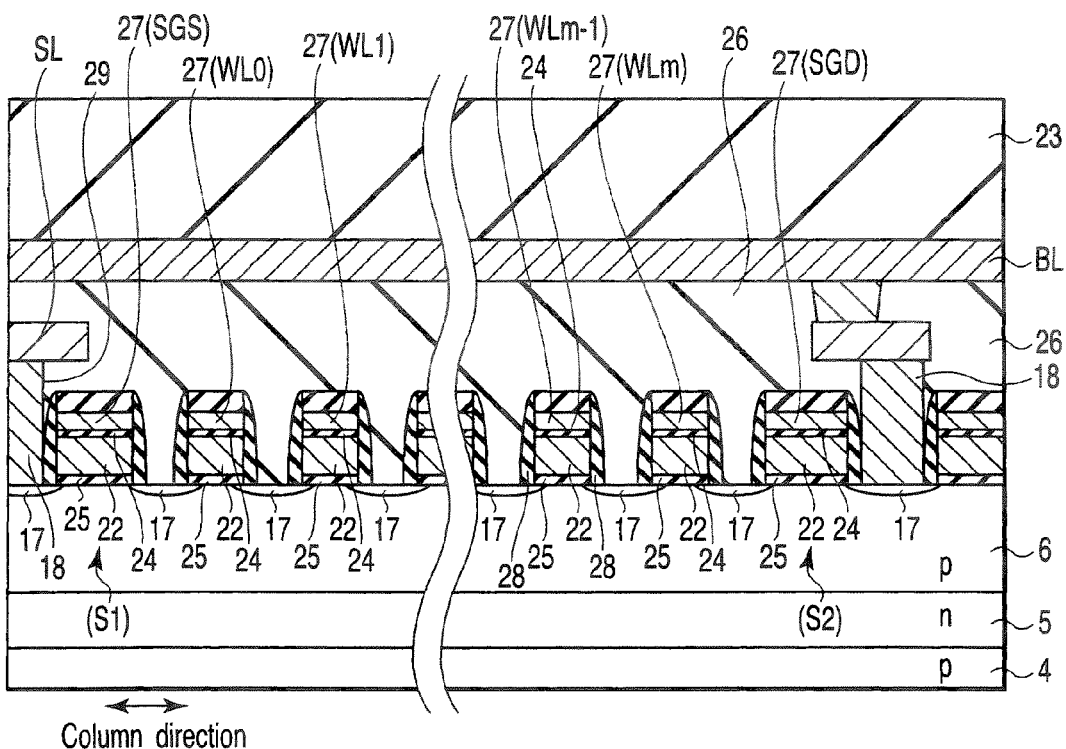
F I G. 4 B

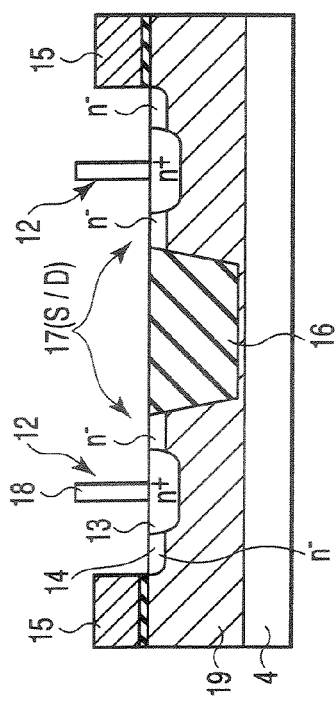
F I G. 6B
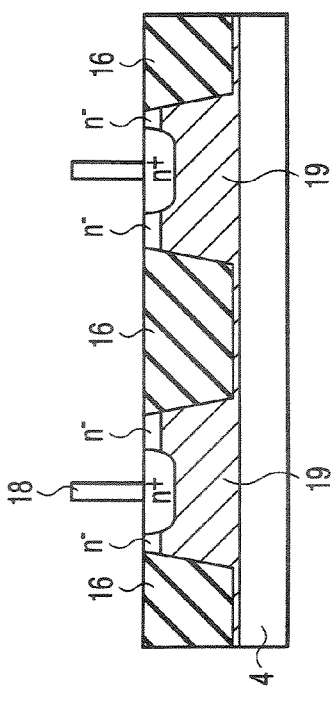
F I G. 6C
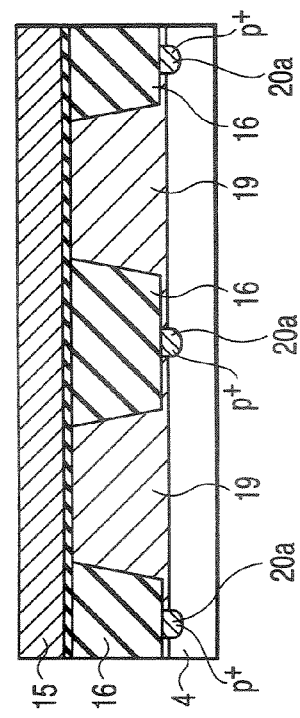
F I G. 6D
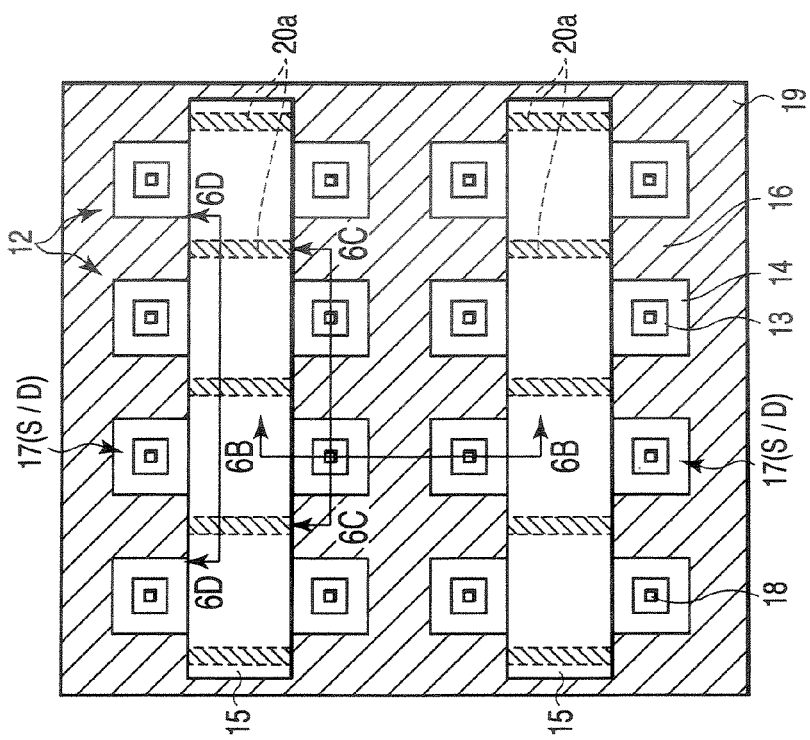
F I G. 6A

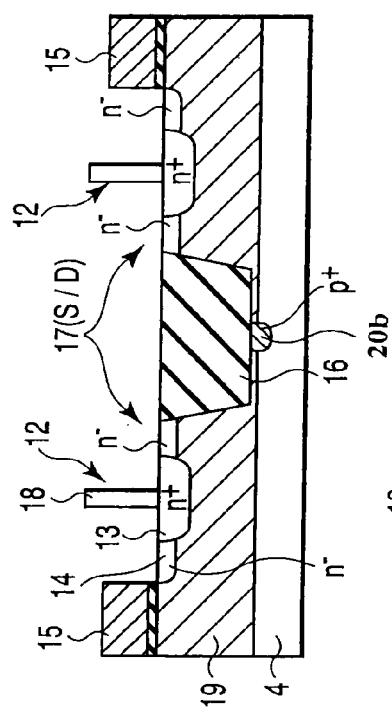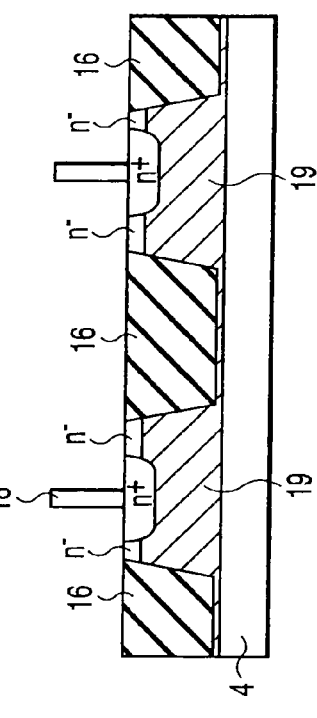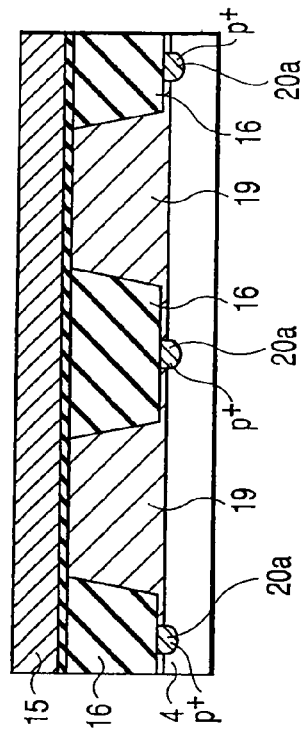
FIG. 7B
FIG. 7C
FIG. 7D
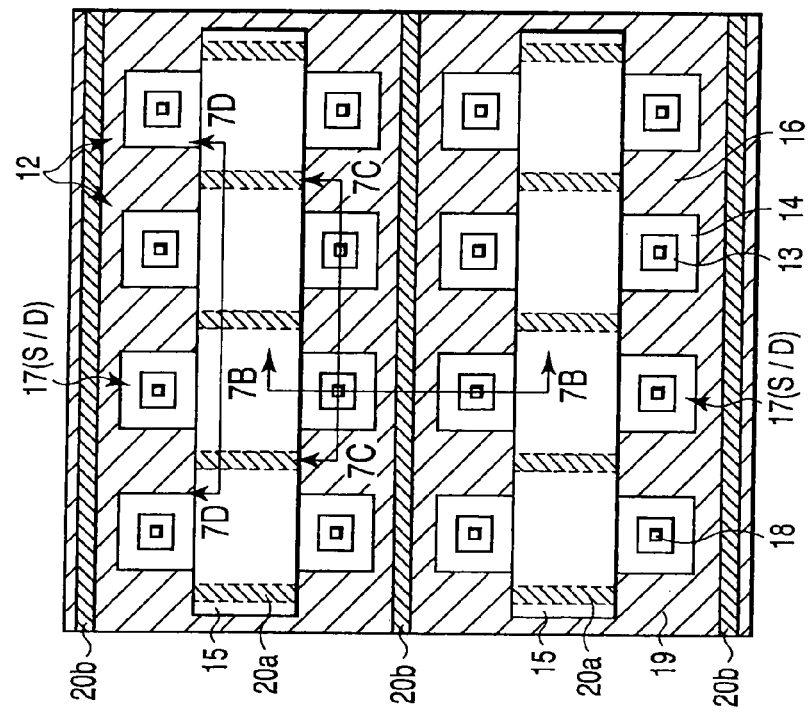
FIG. 7A

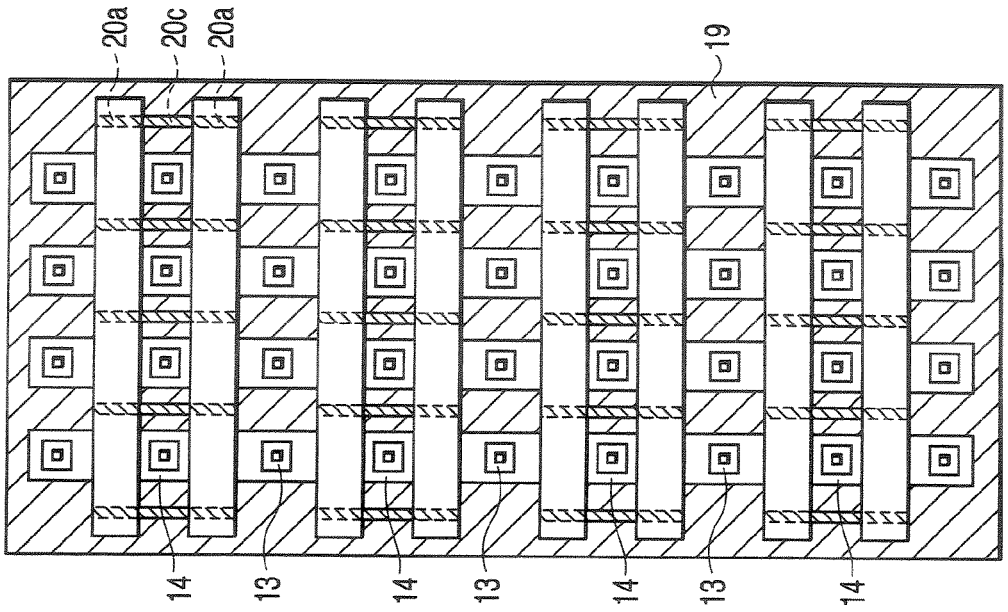
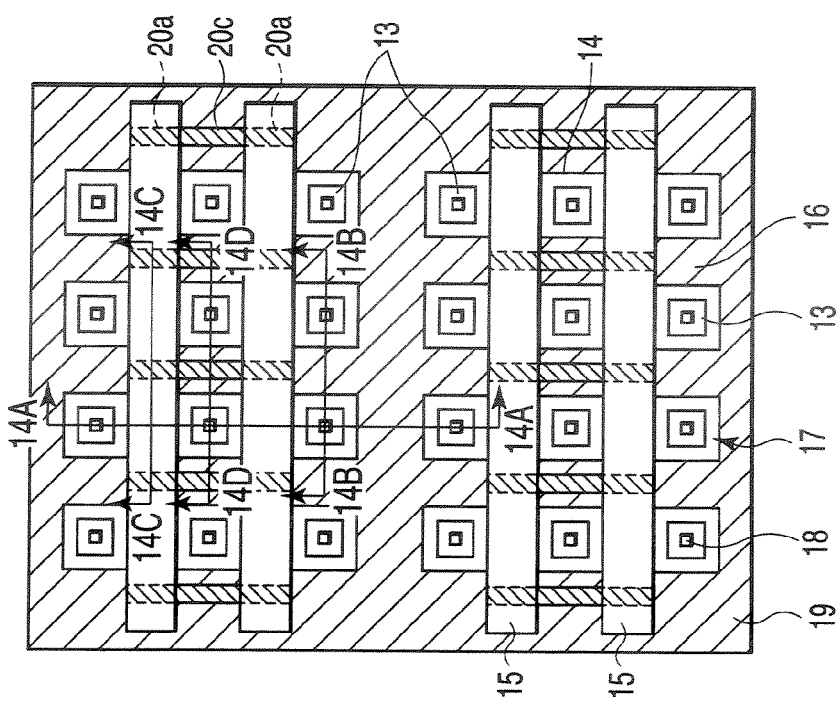
FIG. 13A
FIG. 13B

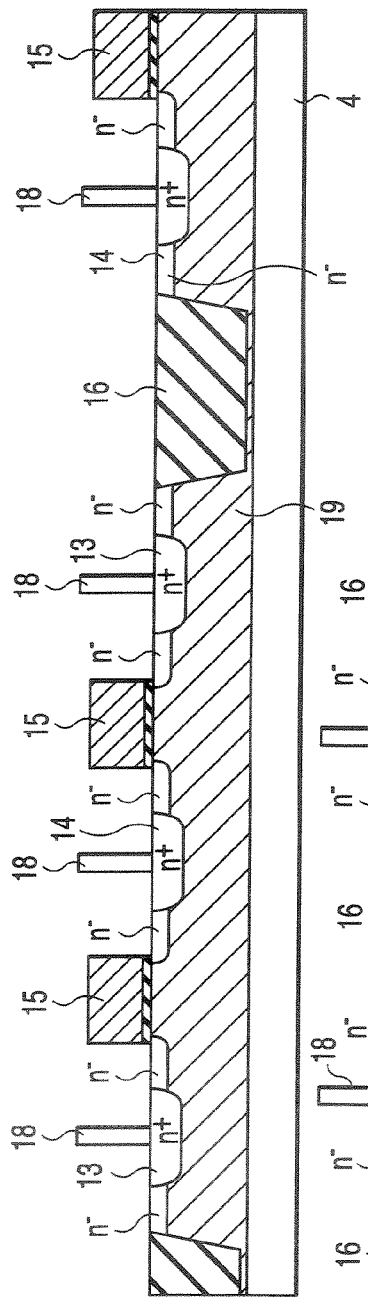
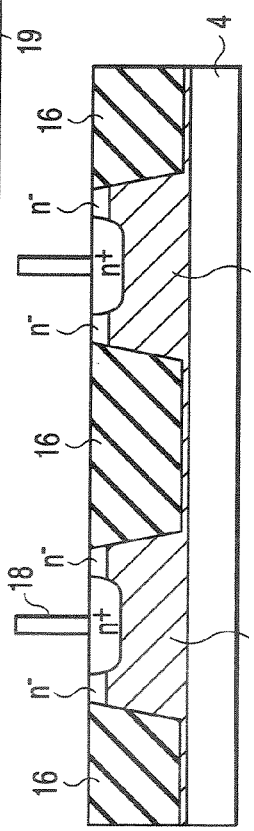
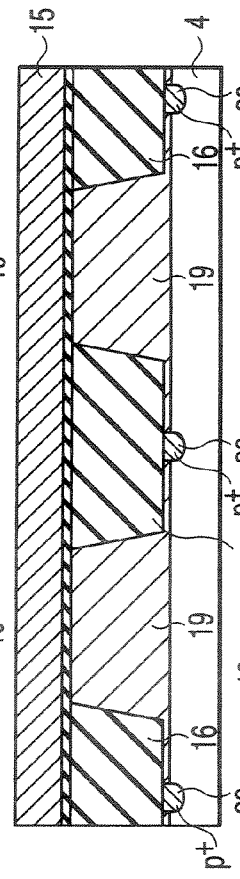
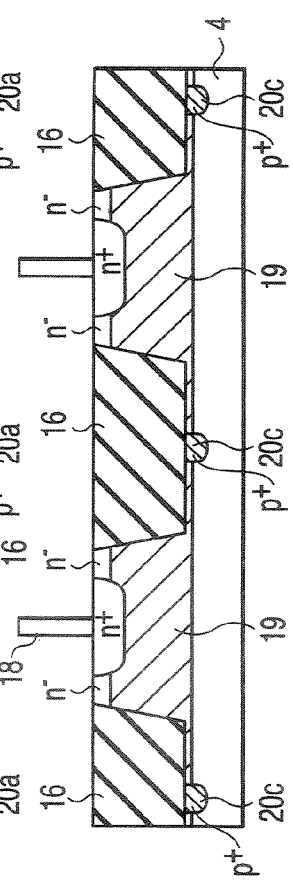
FIG. 14A
FIG. 14B
FIG. 14C
FIG. 14D

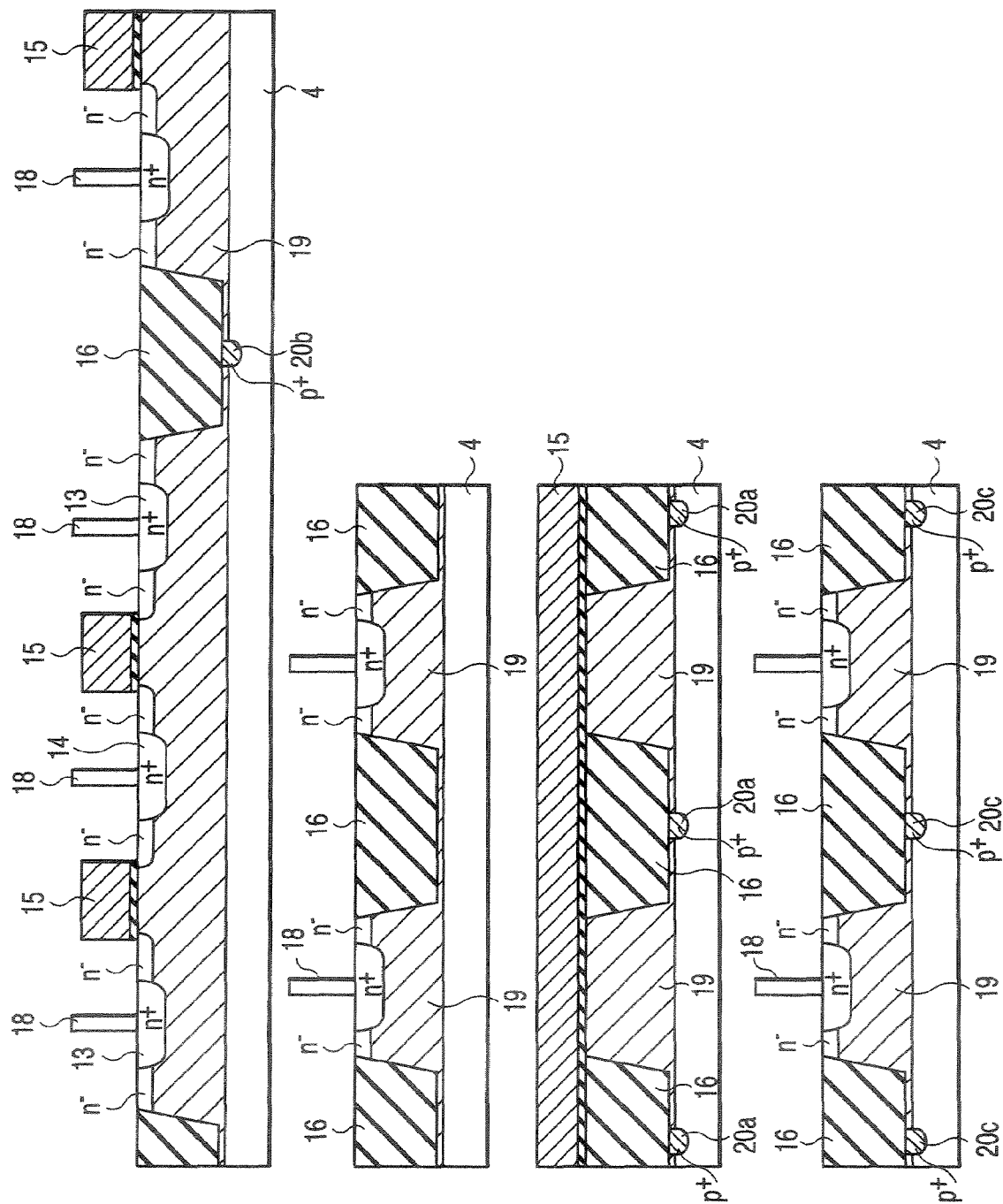

MEMORY CELL ARRAY WITH SPECIFIC PLACEMENT OF FIELD STOPPERS

CROSS-REFERENCE TO RELATED APPLICATIONS

This application is based upon and claims the benefit of priority from prior Japanese Patent Application No. 2006-055044, filed Mar. 1, 2006, the entire contents of which are incorporated herein by reference.

BACKGROUND OF THE INVENTION

1. Field of the Invention

This invention relates to a semiconductor device composed of high voltage transistors which is applied to, for example, the peripheral circuitry of an electrically rewritable semiconductor memory device.

2. Description of the Related Art

One of the nonvolatile semiconductor memory devices is a NAND type EEPROM (refer to, for example, Jpn. Pat. Appln. KOKAI Publication No. 2002-324400). In a NAND type EEPROM, when a NAND cell is written into, a high positive write voltage Vpgm ranging from 15V to 40V is applied to a word line serving as a data select line and 0V or a voltage Vdd is applied to a bit line serving as a data transfer line. Vdd is a voltage in the range of 1V to 5V. Vpgm is supplied from a driving signal line for driving a word line. A word line connect transistor is provided between a word line driving signal line and a word line. The word line connect transistor switches between the transfer and untransfer of Vpgm to a word line with a program selected/unselected block. Vdd is supplied by a driving signal line which drives a bit line. A bit line connect transistor is provided between a bit line driving line and a bit line. The bit line connect transistor is controlled so as to transfer Vdd to a bit line connected to a cell not to be programmed and 0V to a bit line connected to a cell to be programmed.

When a NAND cell is erased from, 0V is applied to the word line of the selected erase block and a high positive voltage Vera in the range of 15V to 30V is applied to the word lines of the unselected erase block, that is, the word lines of the blocks not to be erased from. At this time, the bit lines are kept in the floating state. As the potential of a well in which a NAND cell has been formed rises from 0V to Vera, the high voltage Vera is applied to the bit line through capacity coupling. However, turning off the bit line connect transistor prevents the high voltage from being applied to the sense amplifier. Accordingly, the circuitry on the sense amplifier side does not need a high-voltage transistor whose breakdown voltage is equal to or higher than 15V and therefore can use a transistor which is not needed to consider voltage-proof design, for example, thin gate insulating film. This makes it possible to reduce the area of the circuitry on the sense amplifier side remarkably as compared with a case where the circuitry on the sense amplifier side is composed of high voltage transistors.

As described above, when a memory cell is written into or erased from, the word line connect transistor and the bit line connect transistor require Vpgm or Vera equal to or higher than 15V to be cut off. Therefore, a transistor whose junction breakdown voltage is equal to or higher than 15V is required. However, an attempt to raise the breakdown voltage of the transistor requires the gate length, the distance between the gate electrode and the contact, and the like to be increased. This causes the problem of making the size of the transistor larger and increasing the area of the chip. Accordingly, a semiconductor device with high voltage-proof and small transistors, which decreases the area occupied by the region where transistors are formed, has been required.

BRIEF SUMMARY OF THE INVENTION

According to a first aspect of the invention, there is provided a semiconductor device comprising: a first-conductivity-type semiconductor substrate; a plurality of first transistors formed on the semiconductor substrate, each of which includes a first gate electrode, a second-conductivity-type first diffused layer constituting one of a source region and a drain region, and a second-conductivity-type second diffused layer constituting the other of the source and drain regions, the first gate electrode being shared by said plurality of first transistors; isolation regions which are formed in the semiconductor substrate and isolate said plurality of first transistors from one another; and a first-conductivity-type impurity region which is formed in the region of the semiconductor substrate where said plurality of first transistors are formed in such a manner that the depth of the first-conductivity-type impurity region is greater than the depth of the first and second diffused layers of said plurality of first transistors to control the threshold voltage of the first transistors.

According to a second aspect of the invention, there is provided a semiconductor device comprising: a first-conductivity-type semiconductor substrate; a first transistor which is formed on the semiconductor substrate and which includes a first gate electrode, and a second-conductivity-type first diffused layer and a second-conductivity-type second diffused layer that are formed in the semiconductor substrate on both sides of the first gate electrode, a voltage higher than the voltage supplied to the first gate electrode and the second diffused layer being supplied to the first diffused layer; an isolation region which is formed in the semiconductor substrate and isolates the first transistor from another element; and a first-conductivity-type impurity region which is formed in the region of the semiconductor substrate where the first transistor is formed in such a manner that the depth of the first-conductivity-type impurity region is greater than the depth of the first and second diffused layers of the first transistor to control the threshold voltage of the first transistor.

BRIEF DESCRIPTION OF THE SEVERAL VIEWS OF THE DRAWINGS

FIG. 2 is a circuit diagram of a NAND type EEPROM applied to the first embodiment;

FIG. 4A is a sectional view taken along line 4A-4A of FIG. 3B and FIG. 4B is a sectional view taken along line 4B-4B of FIG. 3B;

FIGS. 6A to 6D show modification 1 of the first embodiment, FIG. 6A is a plan view, FIG. 6B is a sectional view taken along line 6B-6B of FIG. 6A, FIG. 6C is a sectional view taken along line 6C-6C of FIG. 6A, and FIG. 6D is a sectional view taken along line 6D-6D of FIG. 6A;

FIGS. 7A to 7D show modification 2 of the first embodiment, FIG. 7A is a plan view, FIG. 7B is a sectional view taken along line 7B-7B of FIG. 7A, FIG. 7C is a sectional view taken along line 7C-7C of FIG. 7A, and FIG. 7D is a sectional view taken along line 7D-7D of FIG. 7A;

FIGS. 13A and 13B are plan views of modification 2 of the second embodiment;

FIG. 14A is a sectional view taken along line 14A-14A of FIG. 13A, FIG. 14B is a sectional view taken along line 14B-14B of FIG. 13A, FIG. 14C is a sectional view taken along line 14C-14C of FIG. 13A, and FIG. 14D is a sectional view taken along line 14D-14D of FIG. 13A;

FIG. 16A is a sectional view taken along line 16A-16A of FIG. 15A, FIG. 16B is a sectional view taken along line 16B-16B of FIG. 15A, FIG. 16C is a sectional view taken along line 16C-16C of FIG. 15A, and FIG. 16D is a sectional view taken along line 16D-16D of FIG. 15A.

DETAILED DESCRIPTION OF THE INVENTION

Hereinafter, referring to the accompanying drawings, embodiments of the invention will be explained.

In the explanation below, the channel length direction from the source to drain of the bit line connect transistor is defined as a first direction. The channel width direction perpendicular to the channel length is defined as a second direction. The direction perpendicular to the channel width is used synonymously with the first direction. The direction parallel with the channel width is used synonymously with the second direction.

Figure 3A:
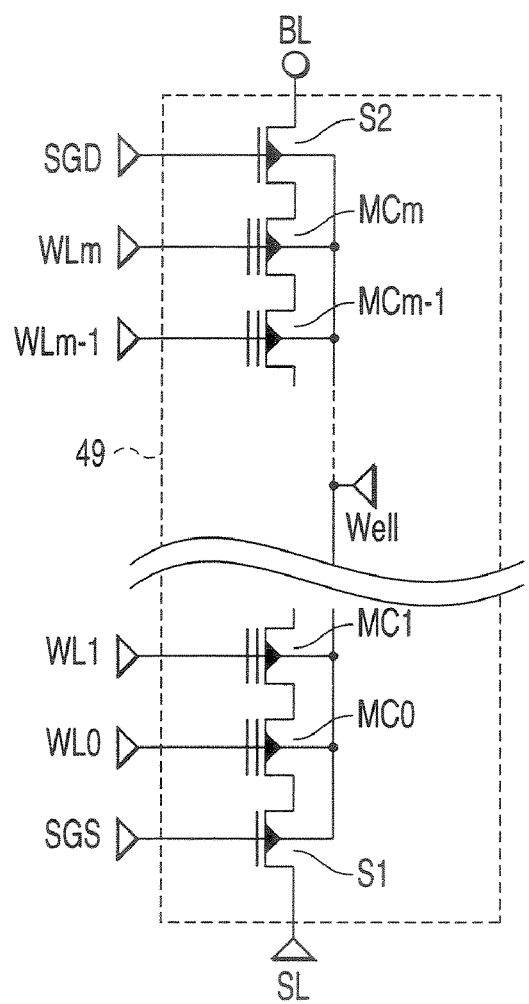
FIG. 3A is a circuit diagram of a NAND cell and FIG. 3B is a plan view of a NAND cell.
Figure 3B:
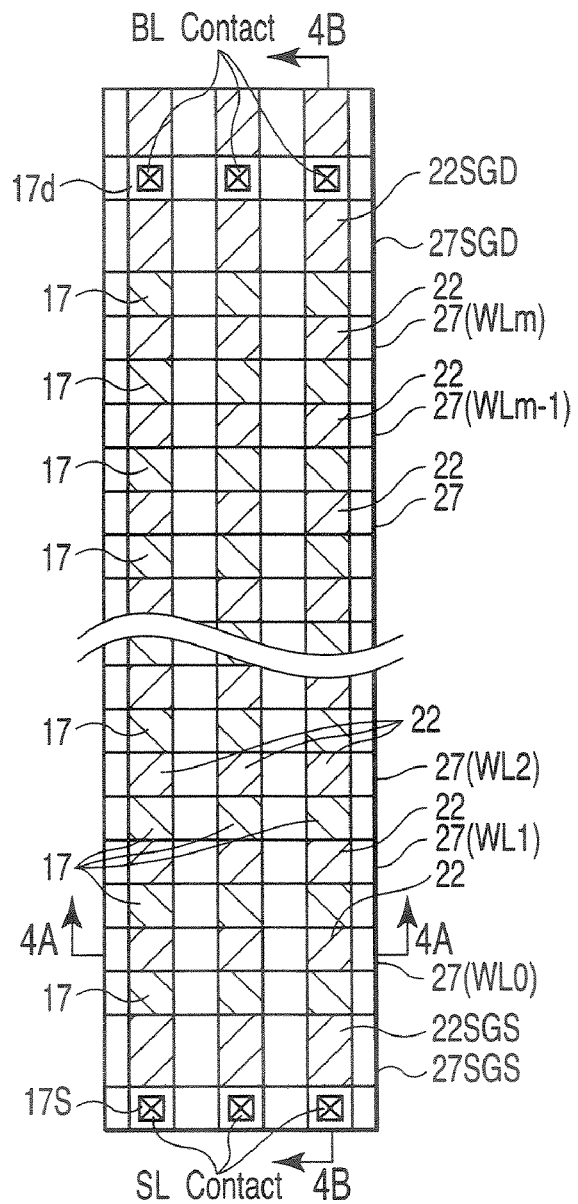

FIG. 2 shows the circuit configuration of a NAND type EEPROM applied to the first embodiment. FIG. 3A is a circuit diagram of a NAND cell serving as the basic configuration of a memory cell array. FIG. 3B is a plan view of a NAND cell. FIG. 4A is a sectional view taken along line 4A-4A of FIG. 3B and FIG. 4B is a sectional view taken along line 4B-4B of FIG. 3B. In the individual drawings, the same parts are indicated by the same reference numerals.

In FIGS. 2, 3A, and 3B, a NAND cell is composed of a plurality of memory cells MC0 to MCm connected in series. The individual NAND cells are connected between the select transistors S2 connected to bit line BL0 and bit lines BL1 to BLn and the select transistors S1 connected to a source line SL. A plurality of NAND cells share word line WL0 and word lines WL1 to WLm and select gate lines SGS, SGD, thereby forming a block. A plurality of units of this block are arranged to form a memory cell array.

As shown in FIGS. 4A and 4B, on a p-type substrate 4, an n-well 5 is formed. A p-well 6 is provided in the n-well 5. At the surface of the p-well 6, NAND cells and select transistors are formed. Such a well structure makes it possible to apply a high positive voltage equal to or higher than 15V to the p-well 6 independently of the p-type substrate 4.

The row decoder shown in FIG. 2 is composed of a decoder 7 which decodes an input address to make it possible to select a block, a level shifter 9 which is for transferring a voltage to a transfer gate electrode 8 according to the output signal of the decoder 7, and a plurality of word line connect transistors 10 which are for transferring a voltage to the word lines and select gate lines.

The plurality of word line connect transistors 10 have their diffused layers on one side connected to the word lines WL0 to WLm and the select gate lines SGS, SGD and those on the other side connected to a CG driver or an SG driver (not shown).

The bit lines BL0 to BLn connected to the individual NAND cells are connected via the bit line connect transistors 12 to a shield power supply node circuit 11 and a sense amplifier 3. The sense amplifier 3 has a latch circuit (not shown) which stores data temporarily in reading or writing data.

In FIG. 2, the shield power supply node 11 is provided so as to face the sense amplifier 3 with the memory cell array 1 therebetween. However, as described later, the sense amplifier 3 and shield power supply node 11 may be provided on the same side of the memory cell array 1.

The bit lines are formed so as to extend in the first direction and the word lines are formed so as to extend in the second direction. This configuration is desirable to arrange the bit line connect transistors 12 in high density.

In FIG. 2, the symbols representing the word line connect transistors 10 and bit line connect transistors 12 indicate that they are high voltage transistors.

Furthermore, in FIGS. 3B, 4A, and 4B, a plurality of memory cells constituting a NAND cell share adjacent diffused layers 17 formed in the p-well 6. Each memory cell is composed of a floating gate 22, an inter-gate insulating film 24, and a control gate 27 stacked one on top of another sequentially on the gate insulating film 25. The select transistors S1, S2 are configured in the same manner as the memory cell, except that a part of the inter-gate insulating film is removed and the floating gate and the control gate are electrically connected. On the sidewall of the individual memory cells and select transistors, a sidewall insulating film 28 is formed. These memory cells and select transistors are covered with an interlayer insulating film 26. On the interlayer insulating film 26, a bit line BL is formed. The bit line BL is connected via a contact 18 to one diffused layer 17 of the select transistor S2. A source line SL formed in the interlayer insulating film 26 is connected via a contact 29 to one diffused layer 17 of the select transistor S1. The bit line BL is covered with an insulating film 23.

Figures 5A, 5B, 5C, 5D, 5E:
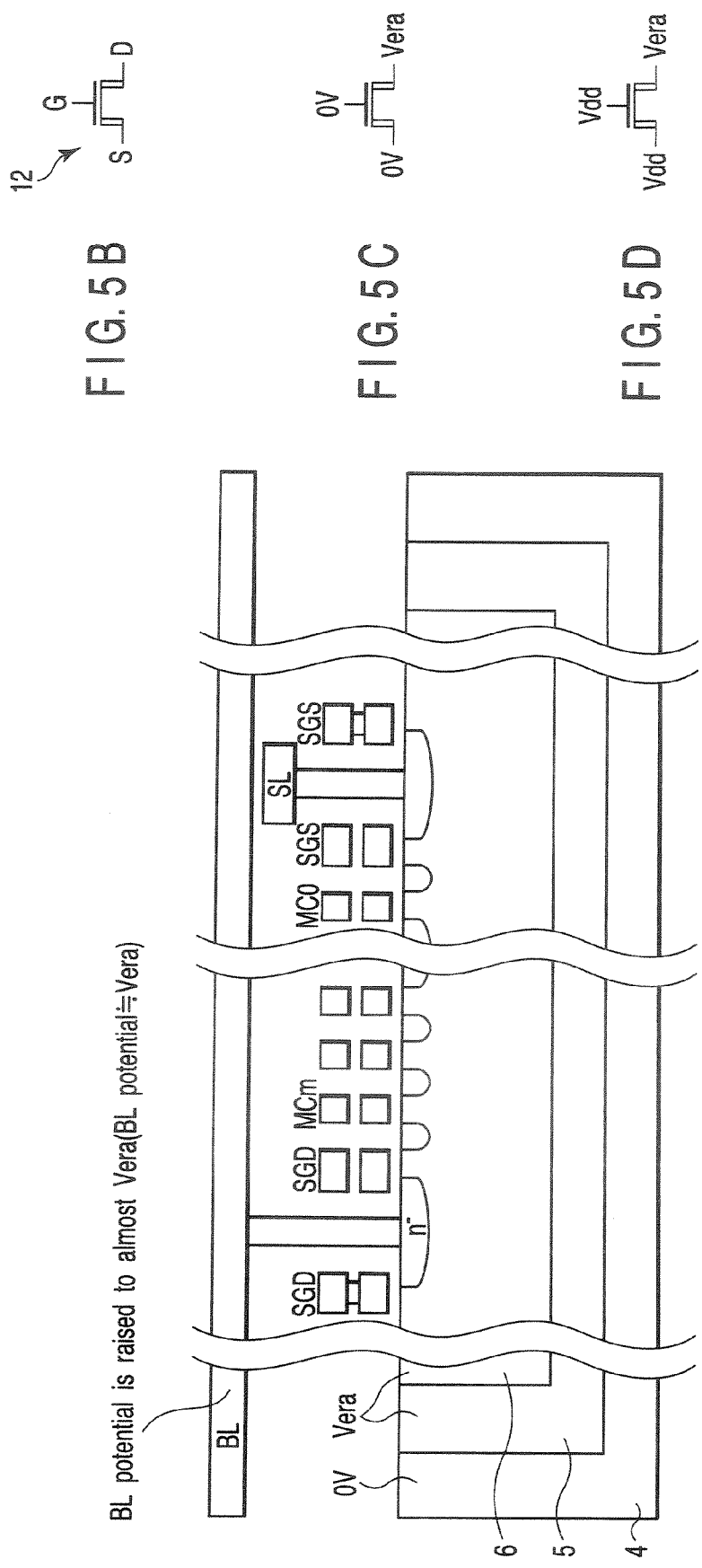
FIG. 5A is a schematic diagram to help explain a potential when a NAND type EEPROM is erased from and each of FIGS. 5B to 5E shows the relationship between voltages in the bit line connect transistor 12.

FIG. 5A is a schematic diagram to help explain the way a NAND type EEPROM is erased from. In FIG. 5A, an erase operation will be explained, centering on the bit line BL. As shown in FIG. 5A, in an erase operation, a positive erase voltage Vera in the range of 15V to 30V is applied to the well 6 in which a cell array has been formed. As a result, a high electric field is produced between the floating gate and the channel of the memory cell, causing FN (Fowler-Nordheim) current to flow, which pulls electrons out of the floating gate. Consequently, the threshold voltage of the cell shifts to the negative side, thereby erasing the data.

At this time, a voltage in the range of, for example, 0V to Vdd is applied to the gate electrodes of the plurality of bit line connect transistors 12 and a voltage higher than the voltage applied to the gate electrodes is applied to the source or drain electrode connected to the sense amplifier 3. Thus, the bit line connect transistors 12 are in the off state. Accordingly, since the bit line BL is kept in the floating state, the bit line BL is raised to almost the erase voltage Vera through the capacity coupling with the p-well 6. The sense amplifier 3 and shield power supply node circuit 11 connected to the bit line BL are composed of low voltage transistors which operate on 5V or lower. Therefore, if the erase voltage Vera is applied to the sense amplifier 3 or shield power supply node circuit 11, their transistors will be destroyed. Accordingly, the bit line connect transistors 12 have the function to cut off the connection to prevent the erase voltage Vera from being transferred to the sense amplifier 3 or shield power supply node circuit 11.

FIGS. 5B to 5E show the relationship between voltages in the bit line connect transistor 12. As shown in FIG. 5B, the bit line connect transistor 12 has its drain electrode D connected to a bit line and its source electrode S connected to a sense amplifier. In an erase operation, the bit line is raised to the erase voltage Vera, which is applied to the drain electrode D. It is necessary to cut off the bit line connect transistor 12 to prevent Vera from being transferred to the source electrode S. FIGS. 5C to 5E show examples of voltages necessary to cut off the bit line connect transistor 12. Applying such voltages as 0V/0V, Vdd/Vdd, or floating/Vdd to the source electrode S/gate electrode G makes it possible to cut off the bit line connect transistor 12. Here, Vdd is a voltage in the range of 1V to 5V. The way of applying voltages is characterized in that only the positive voltage Vdd equal to 5V or lower is applied to the source electrodes, whereas the positive high voltage Vera in the range of 15V to 30V is applied to the drain electrode D.

On the other hand, when a NAND cell is written into, a positive high write voltage Vpgm in the range of 15V to 40V is applied to the word line and 0V or the voltage Vdd is applied to the bit line. Here, the Vdd is a voltage in the range of 1V to 5V. Vpgm is supplied from driving signal lines CG0 to CGm (m is a natural number) for word lines. The voltage Vpgm is selectively transferred via the word line connect transistor 10 to the word line. Vdd is supplied by a driving signal line for bit lines. The voltage Vdd is supplied via the bit line connect transistor to the bit line to which a cell not to be programmed is connected. To the bit line to which a cell to be programmed is connected, 0V is supplied via the bit line connect transistor.

What the inventors have found out from the above is that, since the potential difference between drain terminals to which bit lines are connected in the plurality of bit line connect transistors 12 is Vdd or lower, a junction breakdown voltage and a punch through breakdown voltage which are equal to or higher than 15V are not necessary.

As described above, the bit line connect transistors 12 have to transfer or cut off an erase voltage Vera in the range of 15V to 30V. For this reason, the junction breakdown voltage of the drain electrode has to be equal to or higher than Vera. Moreover, the cut off characteristic between the drain and the source, that is, the punch through leakage current when a voltage is applied to the drain and 0V is applied to the gate and source, has to be made equal to or smaller than, for example, 10 nA. For this reason, in this case, the breakdown voltage of the drain has to be equal to or higher than Vera.

FIGS. 1A to 1D show bit line connect transistors 12 according to the first embodiment. In the drawings in the first embodiment and later, the wiring layers are omitted and what are shown are limited to the patterns below the contacts for convenience of explanation.

Figure 1B:
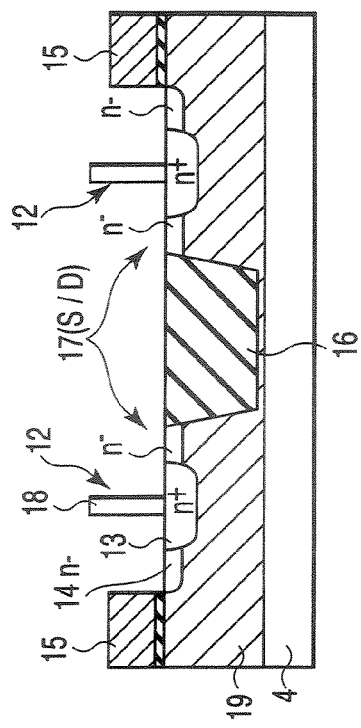
FIG. 1B is a sectional view taken along line 1B-1B of FIG. 1A.
Figure 1C:
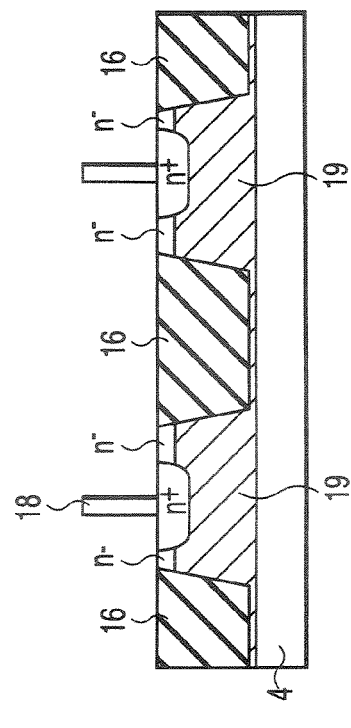
FIG. 1C is a sectional view taken along line 1C-1C of FIG. 1A.
Figure 1D:
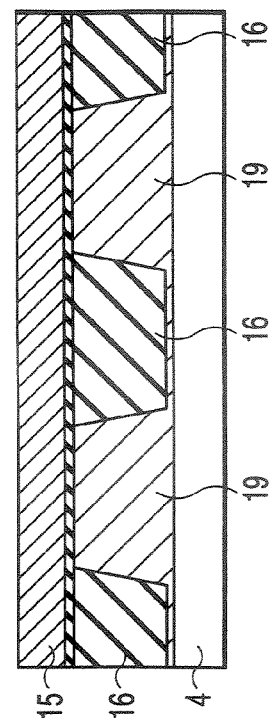
FIG. 1D is a sectional view taken along line 1D-1D of FIG. 1A.
Figure 1A:
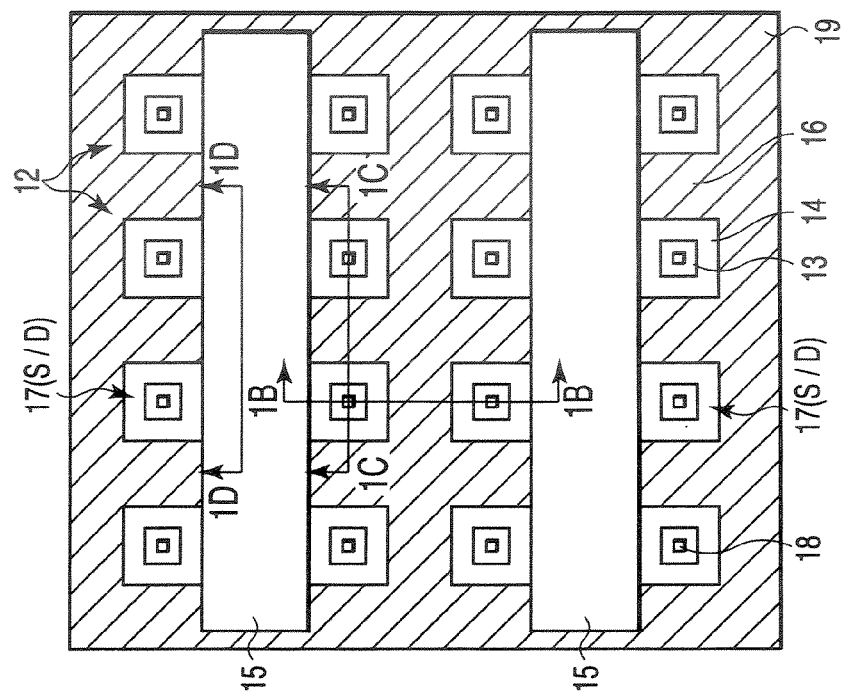
FIG. 1A is a plan view showing a plurality of bit line connect transistors according to a first embodiment of the invention.

FIG. 1A is a plan view of a plurality of bit line connect transistors. FIG. 1B is a sectional view taken along line 1B-1B of FIG. 1A running through the middle of the source and drain regions. FIG. 1C is a sectional view taken along line 1C-1C of FIG. 1A running through the source and drain regions. FIG. 1D is a sectional view taken along line 1D-1D of FIG. 1A running through the middle of the gate electrode 15.

As shown in FIG. 1A, the plurality of bit line connect transistors 12 are provided so as to share the gate electrode 15. In the circuit diagram of FIG. 2, although the plurality of bit line connect transistors 12 are arranged in a line, the gate electrodes 15 are divided into a plurality of lines in a pattern plane. FIG. 1A shows two lines of them.

In FIGS. 1A to 1D, each of the plurality of bit line connect transistors 12 is composed of source and drain regions 17 isolated by an isolation region 16 and a gate electrode 15 immediately above a channel region between them. The source and drain regions 17 are composed of an $n^+$ region 13 and an $n^-$ region 14. Of the source and drain regions 17, the $n^+$ region 13 on one side is connected via a contact plug 18 to a bit line and the $n^+$ region 13 on the other side is connected via a contact plug 18 to a sense amplifier or shield power supply node.

As the contact plug 18, a metal plug produced by forming a plug made of such metal as W, Al, or Cu via barrier metal TiN, Ti, and TaN on the semiconductor region or a polysilicon plug to which, for example, B, P, or As is added in the range of $10^{18}$ cm$^{-3}$ to $10^{22}$ cm$^{-3}$ may be used.

Moreover, the $n^+$ region 13 of the source and drain regions 17 is a region to which, for example, P or As is added in the range of $10^{19}$ cm$^{-3}$ to $10^{22}$ cm$^{-3}$ is added to reduce the contact resistance. The $n^+$ region 13 is formed in an area 1 µm from the periphery of the contact plug 18 (0 µm) so as to enclose the contact plug 18. To increase the junction breakdown voltage, the $n^+$ region 13 is formed away from the isolation region 16 so as not to contact the isolation region 16. The $n^-$ region 14 is formed so as to be in contact with the isolation region 16 around the $n^+$ region 13. The $n^-$ region 14 is a region to which, for example, P or As is added in the range of $10^{16}$ cm$^{-3}$ to $10^{19}$ cm$^{-3}$. The $n^-$ region 14 has a so-called LDD (lightly doped drain) structure. This makes it possible to alleviate the potential difference between the $n^+$ region 13 and the gate electrode 15 and improve the surface junction breakdown voltage when the source and drain regions function as a drain.

The gate length of the bit line connect transistor 12 is in the range of, for example, 0.5 µm to 3 µm. The channel width is in the range of, for example, 1.2 µm to 5 µm. All of the bit line connect transistors 12 are formed on the semiconductor substrate whose p-type impurity concentration is in the range of $1 \times 10^{13}$ cm$^{-3}$ to $5 \times 10^{15}$ cm$^{-3}$.

Unlike a conventional bit line connect transistor, the first embodiment has the p-type impurity region 19 for controlling the threshold voltage formed not only in the vicinity of the channel region but also on the entire surface of the p-type substrate 4 (p-well region 6) in which the plurality of bit line connect transistors 12 are formed as shown in FIGS. 1A to 1D. The p-type impurity region 19 is formed by implanting impurity ions of, for example, boron into the substrate. Furthermore, unlike the conventional equivalent, the first embodiment has no field stopper formed in the isolation region 16 located around each transistor.

Generally, ions of the same type are used as impurity ions implanted to control the threshold voltage and impurity ions implanted as a field stopper. Therefore, impurity ions for controlling the threshold voltage may be used as a field stopper. It is because the peak concentration of the p-type impurity region 19 is in the range of, for example, $1 \times 10^{15}$ cm$^{-3}$ to $2\times10^{17}$ cm$^{-3}$. Since the potential difference between drain terminals to which bit lines are connected is equal to or lower than Vdd as described above, the p-type impurity region 19 having the peak concentration produces a sufficient punch through breakdown voltage.

Although the junction breakdown voltage between the drain terminal to which a bit line is connected and the semiconductor substrate has to be equal to or higher than 15V when a memory cell is erased from, the peak concentration of the p-type impurity region 19 in the first embodiment is in the range of $1\times10^{15}$ cm$^{-3}$ to $2\times10^{17}$ cm$^{-3}$. This makes it possible to maintain the junction breakdown voltage equal to or higher than 15V even when the p-type impurity region 19 is formed on the entire surface of the region in which the plurality of bit line connect transistors are formed.

Eliminating the field stopper from the isolation region 16 makes it possible to decrease the width of the isolation region 16 in the second direction (channel width direction) in the range of 0.1 μm to 1 μm. While the width of the isolation region 16 has to be 0.5 μm to 3 μm in the conventional equivalent, the width may be made 0.4 μm to 2 μm in the first embodiment. Accordingly, the area where the bit line connect transistors 12 are formed can be decreased.

In the first embodiment, impurity ions for controlling the threshold voltage of the bit line connect transistors 12 are implanted into the entire surface of the area in which the plurality of bit line connect transistors 12 are formed, thereby forming a p-type impurity region 19 and eliminating the field stopper formed in the isolation region in the conventional equivalent. This makes it possible to maintain the breakdown voltage between adjacent bit line connect transistors 12 and decrease the width of the isolation region 16 by the width of the field stopper. Consequently, the region in which the bit line connect transistors 12 are formed can be reduced.

The depth of the p-type impurity region 19 is not necessary greater than that of the isolation region and has only to be greater than the depth of the diffused layer of the drain region 17. With this configuration, the breakdown voltage between the diffused layer and the underside of the isolation region can be improved.

Modification 1 of the First Embodiment

FIGS. 6A to 6D show modification 1 of the first embodiment. In the embodiments and modifications below, the same parts as those in the first embodiment are indicated by the same reference numerals and what differs from the first embodiment will be explained.

In the first embodiment, no field stopper has been formed. In modification 1, however, a p-type impurity region 19 which controls the threshold voltage of a transistor is formed on the entire surface of the region in which the bit line connect transistors 12 are formed as in the first embodiment. Moreover, a high concentration p$^+$ field stopper 20a is selectively formed in the direction perpendicular to the channel width in a region below the gate electrode 15 of the isolation region 16. The field stopper 20a is formed by implanting, for example, boron ions into the isolation region 16. The field stopper 20a is formed in the isolation region 16 and in the substrate 4 (p-well region) located below the isolation region 16. The peak concentration of the field stopper 20a is set in the range of, for example, $1\times10^{16}$ cm$^{-3}$ to $2\times10^{18}$ cm$^{-3}$. The field stopper 20a is formed in a region which does not reach the high concentration n$^+$ region 13 in the source or drain region on the bit line side. Specifically, to maintain the field inversion voltage produced by the gate electrode 15, it is desirable that the width of the field stopper 20a should be in the range of, for example, 0.2 μm or more to 1 μm or less. Moreover, the field stopper 20a with this width is formed in the isolation region 16 which has a narrower width than that of a conventional isolation region shown in the first embodiment. Even with such a configuration, the deterioration of the breakdown voltage can be prevented since the p-type impurity region 19 has been formed so as to be in contact with the entire isolation region 16.

With the above configuration, even when an erase voltage Vera equal to or higher than 15V is applied to the drain region, if the voltages of the source electrode and gate electrode are equal to or lower than Vdd, the voltage at the gate end is alleviated by the LDD structure and drops greatly below Vera. Moreover, the high concentration field stopper 20a has been formed in and below the isolation region 16. Consequently, even if a high voltage is applied between the source and drain regions as in an erase operation, it is possible to prevent the entire region below the gate electrode 15 from being depleted.

In modification 1, the field stopper 20a has been formed in the direction perpendicular to the channel width in the region below the gate electrode 15 of the isolation region 16 which isolates the individual bit line connect transistors 12 sharing the gate electrode 15. Therefore, even when a high voltage is applied between the source and drain regions as in an erase operation, the entire region below the gate electrode 15 is prevented from being depleted, which makes the substrate floating effect of bringing the substrate electrically into the floating state less liable to occur. Consequently, a fluctuation in the threshold voltage due to the substrate floating effect can be prevented.

Furthermore, since the field stopper 20a has been formed in the direction perpendicular to the channel width in the region below the gate electrode 15 of the isolation region 16, the punch through breakdown voltage between transistors can be improved and the leakage current via the substrate surface of the isolation region 16 can be decreased.

In addition, according to modification 1, the field stopper 20a has been formed only in the isolation region 16 below the gate electrode 15. Therefore, the area of the region where the plurality of bit line connect transistors 12 have been formed can be reduced and therefore the area occupied by the region where the plurality of bit line connect transistors 12 have been formed in the chip can be reduced.

Moreover, the width of the high concentration field stopper 20a in parallel with the channel width is smaller than the element isolation width in the same direction. Accordingly, a rise in the threshold voltage of the bit line connect transistor 12 due to the field stopper 20a can be suppressed.

Modification 2 of the First Embodiment

FIGS. 7A to 7D show modification 2 of the first embodiment. Modification 2 is such that, in addition to the configuration of modification 1, a field stopper 20b is formed below the isolation region 16 in the direction parallel with the channel width of the bit line connect transistor 12. Specifically, a plurality of field stoppers 20b are formed along the gate electrode 15 in the isolation region 16 adjacent to the source and drain regions 17 of the plurality of bit line connect transistors in the channel length direction (or first direction). A method of forming the field stoppers 20b and the impurity concentration are the same as those of the field stopper 20a.

In modification 2, the field stoppers 20b are formed between the plurality of bit line connect transistors 12 arranged side by side in the channel direction (first direction). As a result, in addition to the effect of modification 1, the punch through breakdown voltage between the source and drain regions 17 adjacent to each other in the first direction can be improved without deteriorating the breakdown voltage between the plurality of bit line connect transistors arranged side by side in the channel direction. Moreover, the dimensions in the direction parallel with the channel width of the bit line connect transistor 12 can be reduced.

Second Embodiment

Figure 8:
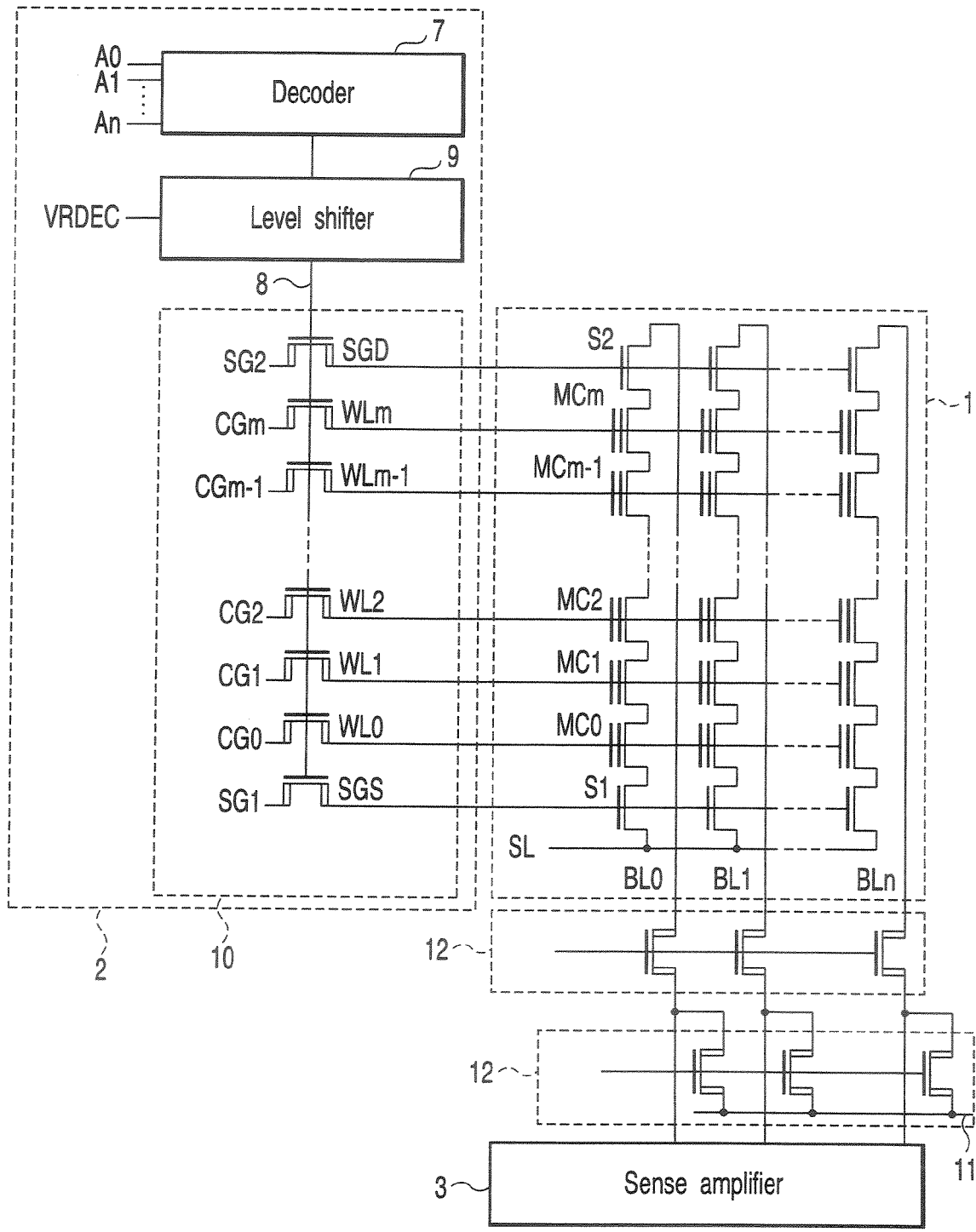
FIG. 8 is a circuit diagram to which a second embodiment of the invention is applied.

FIGS. 8, 9A, 9B, 10A, 10B, and 10C show a second embodiment of the invention. In the first embodiment, the shield power supply node 11 is provided across the memory cell array 1 from the sense amplifier 3 as shown in FIG. 2. In the second embodiment, however, a shield power supply node 11 is provided on the sense amplifier 3 side as shown in FIG. 8. Therefore, the bit line connect transistors 12 which connect the shield power supply node 11 and bit lines BL0 to BLn are also provided on the sense amplifier 3 side. The bit line connect transistors 12 which connect the sense amplifier 3 and bit lines BL0 to BLn and the bit line connect transistors 12 which connect the shield power supply node 11 and bit lines BL0 to BLn can be formed so as to share the source and drain regions.

Figure 9B:
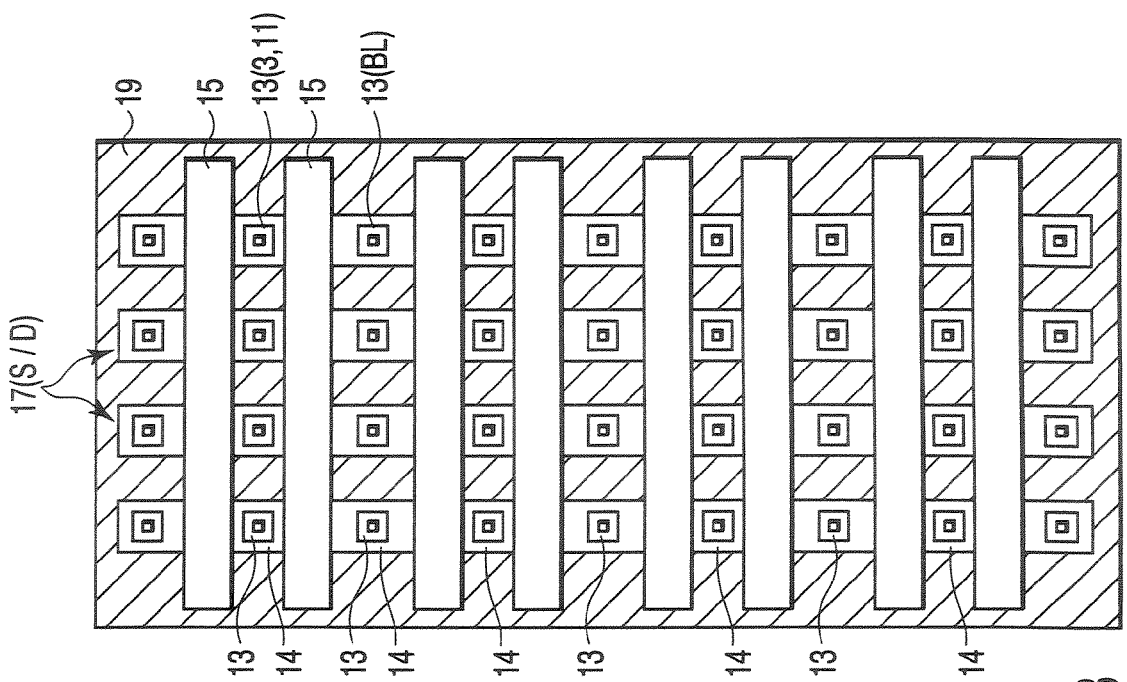
FIGS. 9A and 9B are plan views of the second embodiment.
Figure 9A:
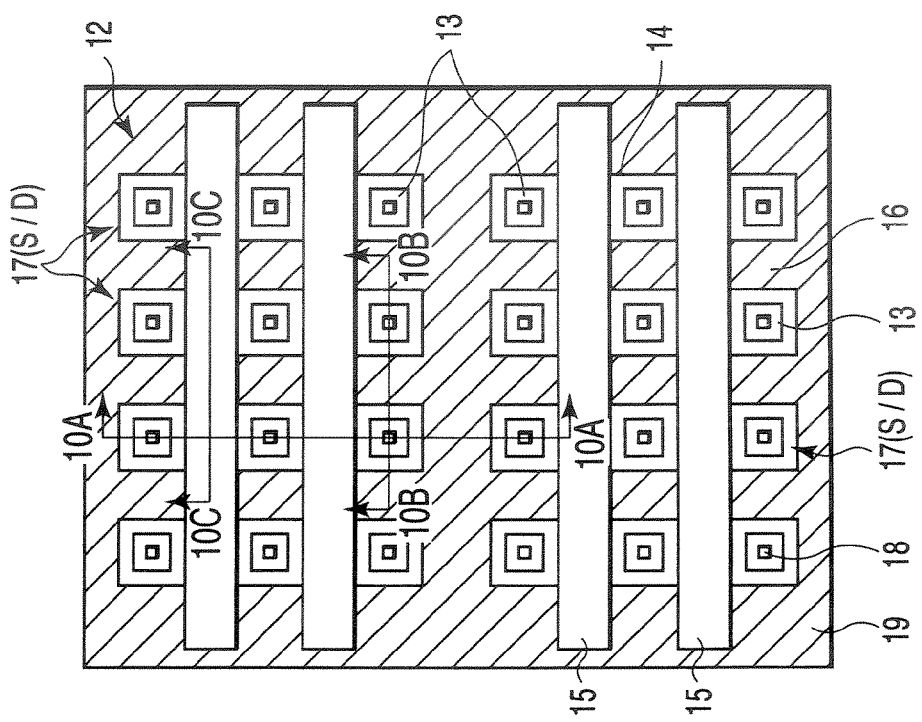
Figure 10A:
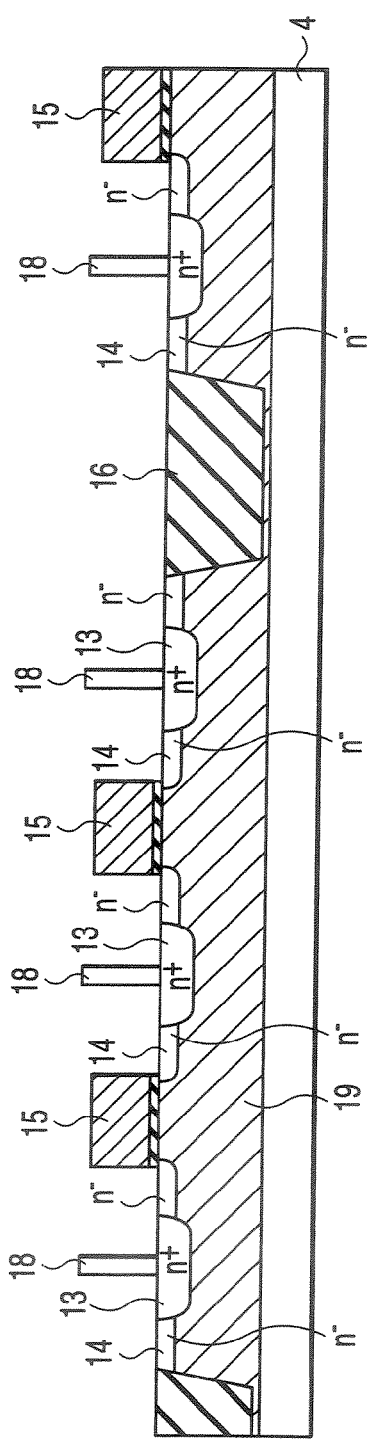
FIG. 10A is a sectional view taken along line 10A-10A of FIG. 9A.
Figure 10B:
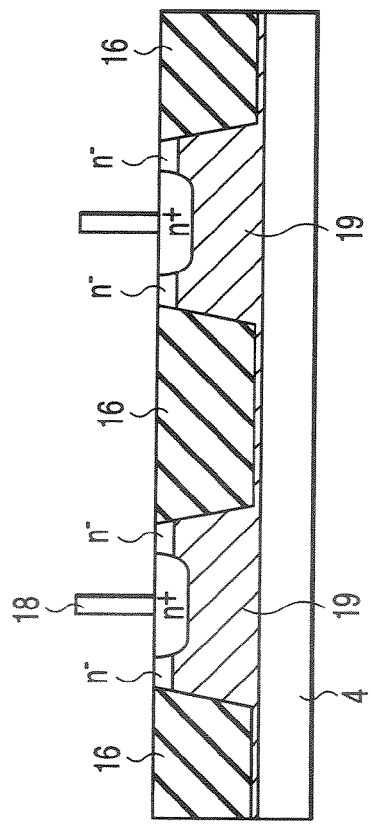
FIG. 10B is a sectional view taken along line 10B-10B of FIG. 9A.
Figure 10C:
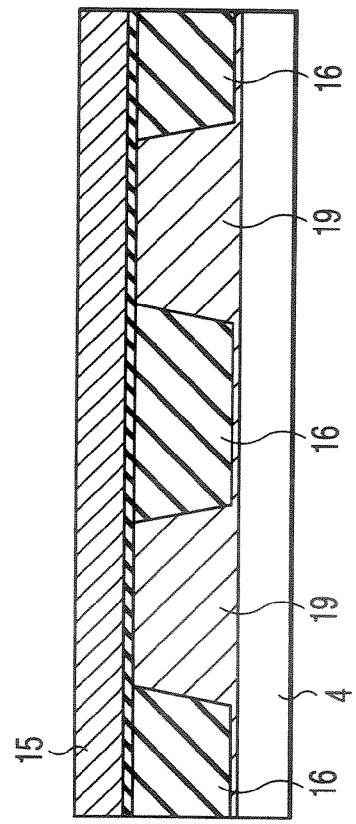
FIG. 10C is a sectional view taken along line 10C-10C of FIG. 9A.
Figure 11A:
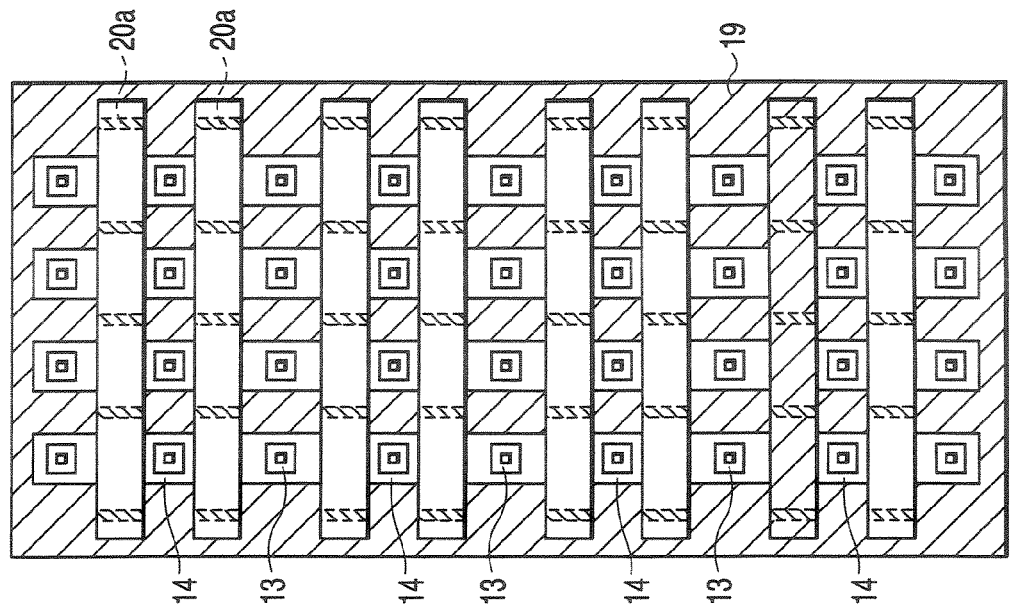
FIGS. 11A and 11B are plan views of modification 1 of the second embodiment.
Figure 11B:
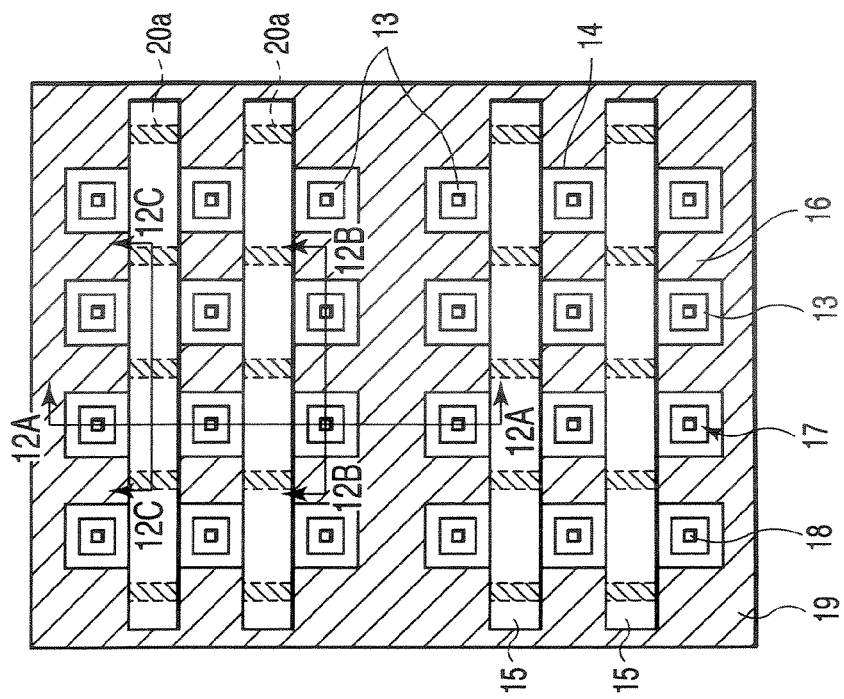
Figure 12A:
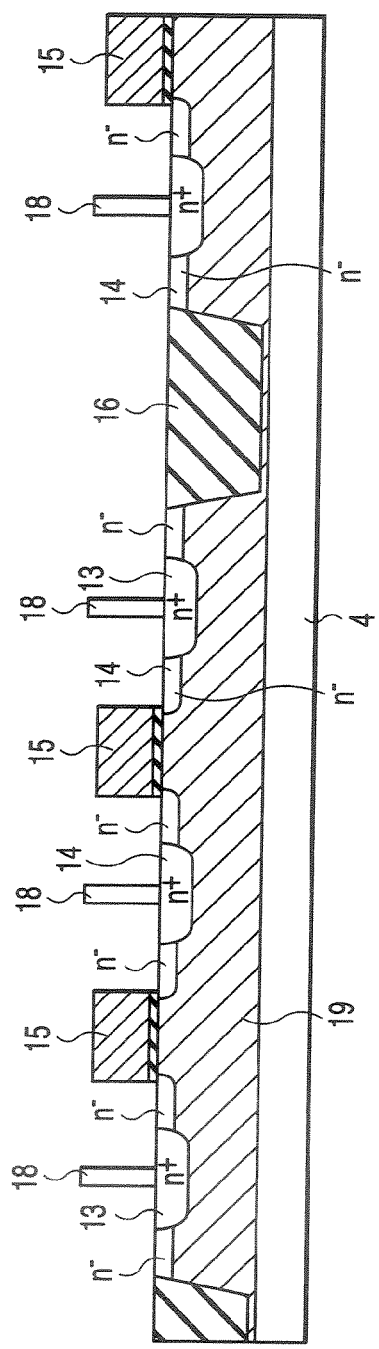
FIG. 12A is a sectional view taken along line 12A-12A of FIG. 11A.
Figure 12B:
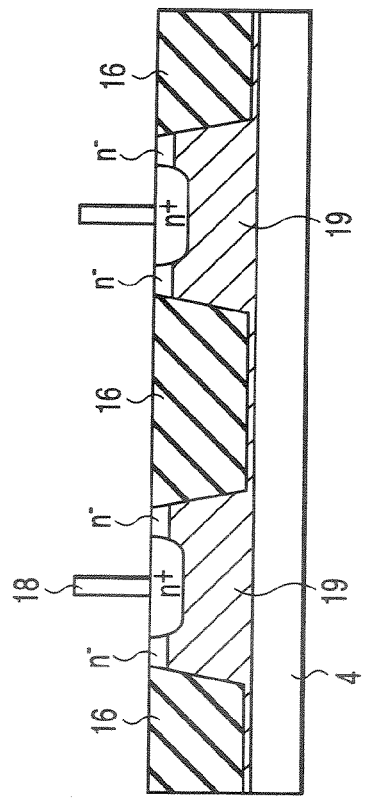
FIG. 12B is a sectional view taken along line 12B-12B of FIG. 11A.
Figure 12C:
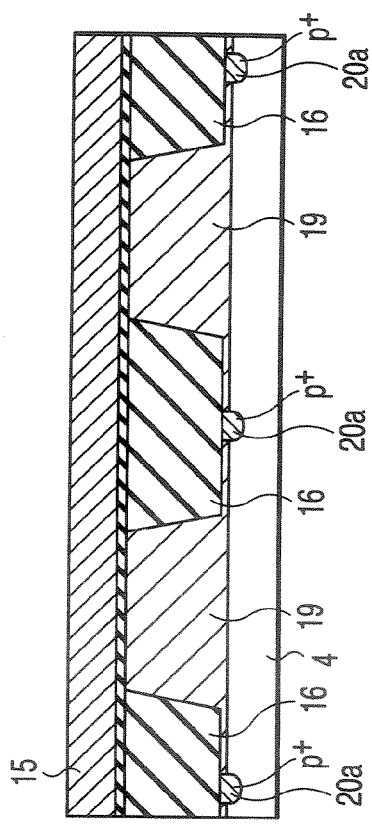
FIG. 12C is a sectional view taken along line 12C-12C of FIG. 11A.
Figure 15B:
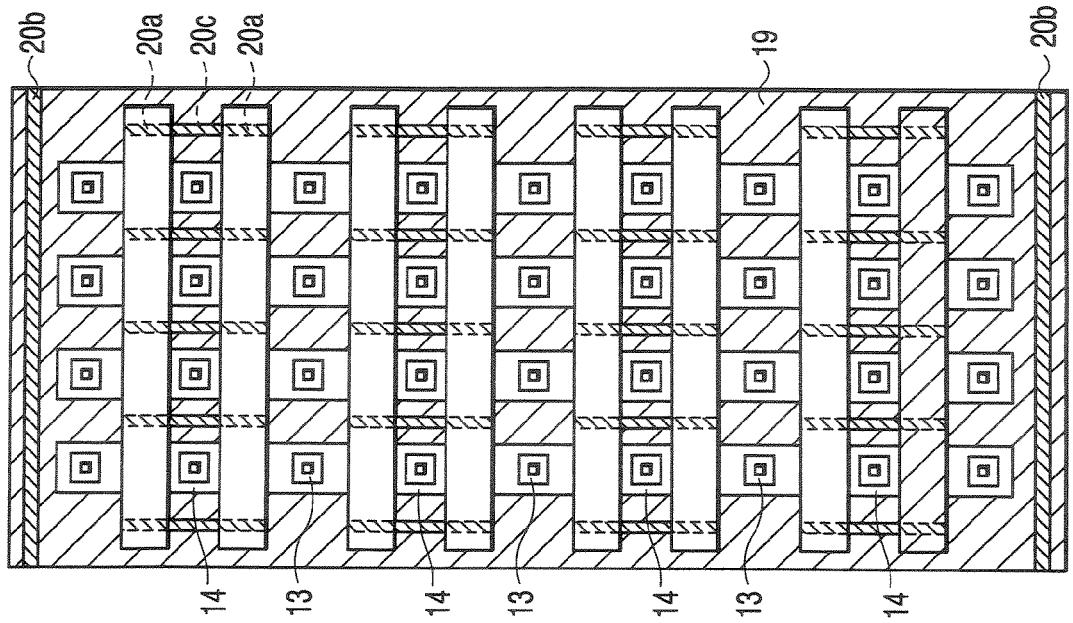
FIGS. 15A and 15B are plan views of modification 3 the second embodiment.
Figure 15A:
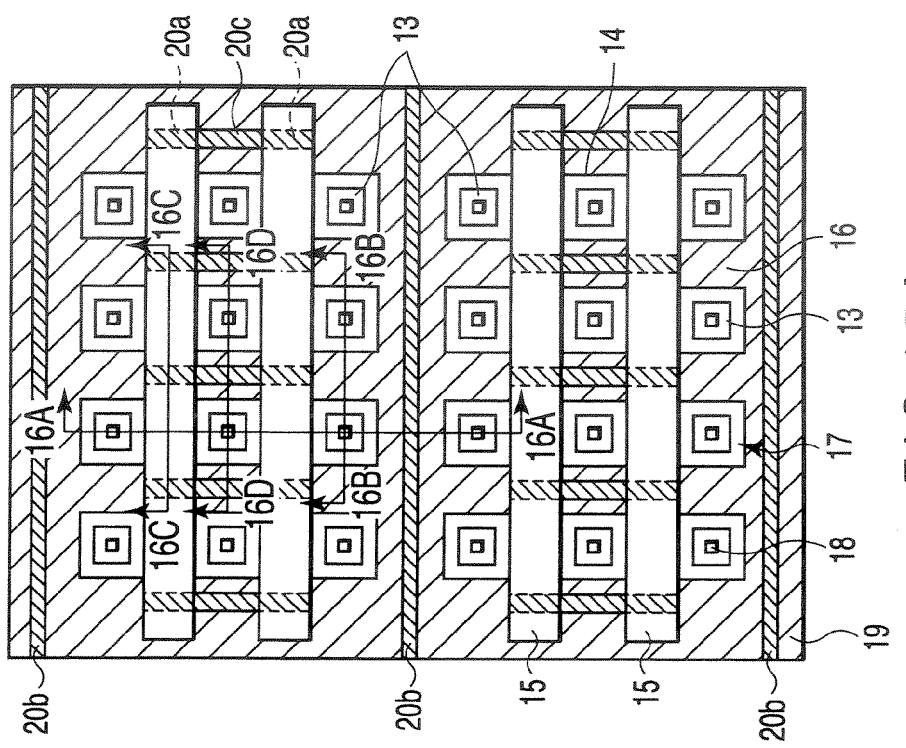

FIG. 9A shows only two lines of a plurality of units of two bit line connect transistors sharing the source and drain regions which are arranged so as to share the gate electrode. FIG. 9B shows an example of arranging a plurality of bit line connect transistors sharing the source and drain regions in such manner that they share the gate electrode.

As shown in FIGS. 9A, 10A, 10B, and 10C, a p-type impurity region 19 is formed in the entire region where a plurality of bit line connect transistors 12 are formed as in the first embodiment. In the isolation region 16, no field stopper has been formed.

The second embodiment produces the same effect as that of the first embodiment. Moreover, sharing the source and drain regions of the bit line connect transistors 12 makes it possible to reduce the area of the region where a plurality of bit line connect transistors 12 are to be formed as compared with the area in the first embodiment.

In addition, as shown in FIG. 9B, when three or more transistors are arranged with the source and drain regions 17 adjacent to one another in the channel length direction being shared, the number of shares of the source and drain regions 17 can be increased. Accordingly, the area for forming a plurality of bit line connect transistors 12 can be reduced further.

In FIGS. 9A and 9B, one of the source and drain regions is connected to a bit line and the other is connected via the contact plug 18 to the sense amplifier 3 or shield power supply node 11. A high voltage is applied to the region connected to the bit line, whereas the high voltage is not applied to the region connected to the sense amplifier 3 or shield power supply node 11. To improve the breakdown voltage of the region connected to the high-voltage-applied bit line, a large diffused layer is needed. However, the region connected to the sense amplifier 3 or shield power supply node 11 to which no high voltage is applied requires no large diffused layer. Accordingly, as shown in FIG. 9B, the distance between the $n^+$ region 13 connected to the sense amplifier 3 or shield power supply node 11 and the gate electrode 15 can be made shorter than the distance between the $n^+$ region 13 connected to the bit line and the gate electrode 15. This makes it possible to realize a much smaller circuit area.

Modification 1 of the Second Embodiment

FIGS. 11A, 11B, 12A, 12B, and 12C show modification 1 of the second embodiment.

Modification 1 is such that a field stopper 20a is added to the configuration of the second embodiment. The field stopper 20a is selectively formed in the isolation region 16 below the gate electrode 15 in the direction perpendicular to the channel width so as not to reach the high concentration $n^+$ region 13 of the source and drain regions 17 on the bit line side. The bit line is connected to, for example, the unshared source and drain regions. The impurity concentration of the field stopper 20a and the formation position and width of the field stopper with respect to the isolation region 16 are the same as in modification 1 to modification 3 of the first embodiment.

In modification 1 of the second embodiment, the high concentration field stopper 20a has been formed in the isolation region 16 in the plurality of bit line connect transistors which share the source and drain regions. Accordingly, even when a high voltage is applied between the source and drain regions as in an erase operation, it is possible to prevent the entire region below the gate electrode 15 from being depleted. This makes a substrate floating effect less liable to take place, which makes it possible to prevent a fluctuation in the threshold voltage due to a substrate floating effect.

For the same reason as in modification 1 of the first embodiment, it is possible to reduce the area of the region in which the plurality of bit line connect transistors 12 sharing the source and drain regions are formed therefore decrease the area occupied by this region in the chip.

Second Modification of the Second Embodiment

FIGS. 13A and 13B and FIGS. 14A to 14D show modification 2 of the second embodiment. What differs from modification 1 of the second embodiment is that a high concentration field stopper 20c is provided not only in the isolation region 16 below the gate electrode 15 but also in the isolation region 16 between the source and drain regions 17 connected to the sense amplifiers or shield power supply nodes adjacent to one another in the direction parallel with the channel width.

According to modification 2 of the second embodiment, the punch through breakdown voltage between the source and drain regions adjacent to one another in the first direction can be improved without impairing the breakdown voltage between transistors connected in the longitudinal direction (first direction) and the dimensions in the direction parallel with the channel width of the bit line connect transistor can be reduced.

In addition, using modification 2 makes it possible to increase the length of the field stopper region in the first direction by the length of the field stopper region 20c as compared with modification 1 of the second embodiment. Accordingly, it is possible to form the field stopper regions 20a, 20c accurately.

In modification 2, too, the distance between the $n^+$ region 13 connected to the sense amplifier 3 or shield power supply node 11 and the gate electrode 15 can be made shorter than the distance between the $n^+$ region 13 connected to the bit line and the gate electrode 15. This makes it possible to realize a much smaller circuit area.

Furthermore, in modification 2, the field stopper region 20c has been formed in the isolation region 16 formed next to the n+ region 13 connected to the sense amplifier 3 or shield power supply node 11. Only a voltage equal to or lower than Vdd is applied to the node on the sense amplifier 3 side. Therefore, the junction breakdown voltage can be satisfied sufficiently.

Modification 3 of the Second Embodiment

FIGS. 15A and 15B and FIGS. 16A to 16D show modification 3 of the second embodiment.

In modification 3 of the second embodiment, what differs from modification 2 of the second embodiment is that a field stopper 20b is further formed in the isolation region 16 in the direction parallel with the channel width.

According to modification 3, the punch through breakdown voltage between the source and drain regions adjacent to one another in the first direction can be improved. Moreover, the dimensions in the direction parallel with the channel width of the bit line connect transistor can be reduced without impairing the breakdown voltage between transistors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first-conductivity-type semiconductor substrate;
a plurality of first transistors formed on the semiconductor substrate, each of which includes a first gate electrode, a second-conductivity-type first diffused layer constituting one of a source region and a drain region, and a second-conductivity-type second diffused layer constituting the other of the source and drain regions, the first gate electrode being shared by said plurality of first transistors;
isolation regions which are formed in the semiconductor substrate and isolate said plurality of first transistors from one another;
a first-conductivity-type impurity region which is formed in a region of the semiconductor substrate where said plurality of first transistors are formed in such a manner that the depth of the first-conductivity-type impurity region is greater than the depth of the first and second diffused layers of said plurality of first transistors; and
a plurality of first field stoppers which are formed in the channel length direction in the isolation region located below the first gate electrode and a plurality of second field stoppers which are formed in the channel length direction in the isolation region adjacent to the second diffused layers and which are not formed in the channel length direction in the isolation region located between the first diffused layers of the plurality of first transistors, wherein
the plurality of second field stoppers contact at least one of the plurality of first field stoppers and are separated from each other in the channel width direction, and
the plurality of first field stoppers and the plurality of second field stoppers are separated from any other field stoppers in the isolation region between the plurality of first transistors.

2. The semiconductor device according to claim 1, wherein
a voltage higher than the voltage applied to the second diffused layer and the first gate electrode is applied to the first diffused layer,
the voltage applied to the first diffused layer is in a range of 15V to 30V, and
the voltage applied to the second diffused layer is in a range of 1V to 5V.

3. The semiconductor device according to claim 1, further comprising a third field stopper which is formed along the first gate electrode of the plurality of first transistors in the isolation region in the vicinity of the first diffused layers, the third field stopper being separated from the plurality of first and second field stoppers.

4. The semiconductor device according to claim 1, wherein each of said plurality of first transistors is a transistor which electrically connects a bit line to a sense amplifier.

5. The semiconductor device according to claim 1, wherein the isolation width in the channel width direction is more than 0.1 μm and less than 0.5 μm.

6. A semiconductor device comprising:
a first-conductivity-type semiconductor substrate;
a first transistor which is formed on the semiconductor substrate and which includes a first gate electrode, and a second-conductivity-type first diffused layer and a second-conductivity-type second diffused layer that are formed in the semiconductor substrate on both sides of the first gate electrode, a voltage higher than the voltage supplied to the first gate electrode and the second diffused layer being supplied to the first diffused layer;
an isolation region which is formed in the semiconductor substrate and isolates the first transistor from another element;
a first-conductivity-type impurity region which is formed in a region of the semiconductor substrate where the first transistor is formed in such a manner that the depth of the first-conductivity-type impurity region is greater than the depth of the first and second diffused layers of the first transistor; and
a first field stopper which is formed in the channel length direction in the isolation region located below the first gate electrode and a second field stopper which is formed in the channel length direction in the isolation region adjacent to the second diffused layer and which is not formed in the channel length direction in the isolation region adjacent to the first diffused layer of the first transistor, wherein
the second field stopper contacts the first field stopper,
the first field stopper and the second field stopper are separated from any other field stopper in the isolation region, and
the first and the second field stoppers are constituted by first-conductive-type impurities, peak impurity concentrations of the first-conductivity-type impurities of the first and the second field stoppers being set in a range of $1\times10^{16}$ cm$^{-3}$ to $2\times10^{18}$ cm$^{-3}$.

7. The semiconductor device according to claim 6, wherein the first diffused layer is connected to a bit line.

8. The semiconductor device according to claim 6, wherein the second diffused layer is connected to a power supply node.

9. The semiconductor device according to claim 6, further comprising a third field stopper which is formed in the channel width direction of the first transistor in the isolation region in the vicinity of the first diffused layer, the third field stopper being separated from the first and the second field stoppers.

10. The semiconductor device according to claim 6, wherein the first transistor is a transistor which electrically connects a bit line to a sense amplifier.

11. The semiconductor device according to claim 6, wherein the isolation width in the channel width direction is more than 0.1 μm and less than 0.5 μm.

* * * * *